United States Patent
Qureshi et al.

(10) Patent No.: US 11,245,364 B2
(45) Date of Patent: Feb. 8, 2022

(54) AMPLIFYING DEVICE AND AMPLIFYING SYSTEM COMPRISING THE SAME

(71) Applicant: Ampleon Netherlands B.V., Nijmegen (NL)

(72) Inventors: Abdul Raheem Qureshi, Nijmegen (NL); Sergio Carlos da Conceicao Pires, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 84 days.

(21) Appl. No.: 16/817,811

(22) Filed: Mar. 13, 2020

(65) Prior Publication Data
US 2020/0295714 A1 Sep. 17, 2020

(30) Foreign Application Priority Data
Mar. 15, 2019 (NL) ...................................... 2022750

(51) Int. Cl.
| H03F 1/02 | (2006.01) |
| H03F 1/56 | (2006.01) |
| H03F 3/195 | (2006.01) |
| H03F 3/21 | (2006.01) |
| H03F 3/24 | (2006.01) |

(52) U.S. Cl.
CPC ........... *H03F 1/0288* (2013.01); *H03F 1/565* (2013.01); *H03F 3/195* (2013.01); *H03F 3/211* (2013.01); *H03F 3/245* (2013.01); *H03F 2200/423* (2013.01)

(58) Field of Classification Search
CPC ........ H03F 1/0288; H03F 1/565; H03F 3/195; H03F 3/211; H03F 3/245; H03F 2200/423

USPC ......................................................... 330/295
See application file for complete search history.

(56) References Cited

PUBLICATIONS

Grebennikov, A.,"Broadband PA Techniques for Efficiency Enhancement" IEEE MTT-S 2014 Power Amplifier Symposium. (Year: 2014).*
NL Search Report and Written Opinion, NL Application No. 2022750, dated Dec. 13, 2019, 27 pages.
Qureshi et al., "A 112W GaN Dual Input Doherty-Outphasing Power amplifier," IEEE MTT-S International Microwave Symposium (2016).
Hakala et al., "A 2.14-GHz Chireix Outphasing Transmitter," IEEE Transactions on Microwave Theory and Techniques, vol. 53, No. 6, pp. 2129-2138 (2005).
Qureshi et al., "High Efficiency and Wide Bandwidth Quasi-Load Insensitive Class-E Operation Utilizing Package Integration," IEEE Transactions on Microwave Theory and Techniques (2018).
Qureshi, "High Efficiency RF Power Amplifier Architectures," TU Delft, ISBN 978-94-6203-071-8 (2012).

* cited by examiner

*Primary Examiner* — Hafizur Rahman
(74) *Attorney, Agent, or Firm* — McDonnell Boehnen Hulbert & Berghoff LLP

(57) ABSTRACT

The present invention relates to an amplifying device and to an amplifying system comprising the same. According to the present invention, an amplifier line-up is presented comprising four amplifying units which is operable in a Doherty mode and an outphasing mode. By integration of Chireix compensating elements in the matching networks used in the amplifying units a bandwidth improvement can be obtained.

19 Claims, 5 Drawing Sheets

AMPLIFYING DEVICE AND AMPLIFYING SYSTEM COMPRISING THE SAME

CROSS-REFERENCE TO RELATED APPLICATION

The present application is a non-provisional patent application claiming priority to Netherlands Patent Application No. 2022750 filed Mar. 15, 2019, the contents of which are hereby incorporated by reference.

TECHNICAL FIELD

The present invention relates to an amplifying device and to an amplifying system comprising the same.

SUMMARY

In next generation cellular communication systems, the base station needs to be more flexible and able to operate across several frequency bands and different standards. This task is requiring the power amplifier stage to operate over a wide bandwidth with a high average efficiency.

So far, most high-efficiency amplifier implementations were mainly focused on handling moderate peak-to-average power ratio's (PAPRs), whereas keeping the high average efficiency over a wide frequency range is still a challenge.

Doherty power amplifiers (DPAs) are known for their excellent performance at high power operation, whereas offering an efficiency improvement at power back-off. However, the performance of these amplifiers when amplifying signals having a high PAPR (>9 dB) can be considered moderate. On the other hand, outphasing amplifiers are known for their relatively high efficiencies at large power back-off levels.

In the paper "A 112 W GaN Dual Input Doherty-Outphasing Power amplifier", by Qureshi et al, 2016, IEEE MTT-S International Microwave Symposium (IMS), IEEE, 2016. p. 1-4, a combination of a Doherty amplifier and an outphasing amplifier is presented. More in particular, an amplifying device is disclosed for providing an amplified signal to a load, which comprises a first input and a second input, and a plurality of packaged amplifying units, each amplifying unit comprising a respective amplifier, wherein each of a first amplifying unit and a second amplifying unit among said plurality of amplifying units has an input connected to the first input, and wherein each of a third amplifying unit and a fourth amplifying unit among said plurality of amplifying units has an input connected to the second input.

Within the context of the present invention, a packaged amplifying unit should be construed as comprising a package having dedicated input and output terminals. For example, the package may comprise a package substrate and package leads. One or more semiconductor dies can be arranged on the package substrate. A radiofrequency (RF) power transistor can be formed on the semiconductor die(s). Electrical connection between the leads and the power transistor(s) can be realized using one or more bondwires.

The wording packaged amplifying unit should not be construed as being limited to a particular packaging technology. Molded packages, ceramic packages, multi-chip modules and the like are all considered to be examples of a packaged amplifying unit. Typically, a packaged amplifying unit is handled, at least during part of the manufacturing of the amplifying device, as a single component.

The disclosed device further comprises a plurality of impedance matching networks, each impedance matching network being coupled to a respective amplifier. The amplifying device is configured to be operable in an outphasing mode in which the amplifiers of the second and third amplifying units are operational and in which the amplifiers of the first and fourth amplifying units are off, and wherein the amplifiers of the second and third amplifying units cooperate to form an outphasing amplifier. The device may further operate in a Doherty mode in which the amplifiers of the first and second amplifying units cooperate to form a first Doherty amplifier and in which the amplifiers of the third and fourth amplifying units cooperate to form a second Doherty amplifier. Signals amplified by the plurality of packaged amplifying units are combined in a combining node. Typically, the load can be electrically connected to the combining node via one or more matching networks.

To be able to operate as an outphasing amplifier, the second and third amplifier should see different loads. An example by which this can be achieved is to use a so-called Chireix combiner. This is explained in more detail in the paper "A 2.14-GHz Chireix Outphasing Transmitter", by Hakala et al, IEEE Transactions on microwave theory and techniques, Vol. 53, No. 6, pp. 2129-2138, June 2005.

The Chireix combiner comprises Chireix compensating elements. More in particular, the amplifying device should comprise a first and second Chireix compensating element for compensating a reactive part of a load seen by the amplifier of the second and third amplifying unit, respectively, for a predefined outphasing angle when operating in the outphasing mode.

For theoretical Doherty operation, the main amplifier should be connected via a quarter-wavelength transmission line to the combining node, whereas the peak amplifier should be connected directly to the combining node. Further to this, there should be no internal phase rotation inside the main amplifier and the peak amplifier. In this manner, the desired load modulation is achieved whereby at low powers, when the peak amplifier is switched off, the main amplifier is presented with a larger load than at high powers, when the peak amplifier is switched on. This desired load modulation is obtained due to the 90 degrees rotation by the quarter-wavelength transmission line.

Internal rotation exists between the internal drain of the power field-effect transistor that is used for the main or peak amplifier and the output of that amplifier. A non-zero internal rotation can be attributed to device parasitics, such as the output capacitance, and package parasitics. In practice, the internal rotation is therefore non-zero. Furthermore, the typical output impedance of power field-effect transistors is relatively low. To address these problems, most Doherty amplifiers use phase offset lines and impedance matching networks.

In the abovementioned known device by Qureshi et al, transmission lines realized on printed circuit board outside of the packaged amplifying unit are used to match the output impedance of each amplifying unit to a predefined impedance. These transmission lines are coupled to offset lines. The offset lines that are in series with the first and fourth amplifying units are each directly coupled to the combining node of the device, whereas the offset lines that are in series with the second and third amplifying units are coupled to the combining node using quarter-wave length transmission lines.

In the device of Qureshi et al, the amplifiers of the second and third amplifying units each act as a main amplifier in the Doherty mode, and the amplifiers of the first and fourth amplifying units each act as a peak amplifier. To allow proper operation as a Doherty amplifier, it is important that the phase rotation between the intrinsic output, i.e. drain, of the power field-effect transistor in the amplifiers of the first and fourth amplifying units and the combining node substantially equals n×180 degrees, wherein n is an integer larger than 0. Similarly, the phase rotation between the intrinsic output, i.e. drain, of the power field-effect transistor in the amplifiers of the second and third amplifying units and the impedance inverter should also substantially equal n×180 degrees, wherein n is an integer larger than 0.

In the device of Qureshi et al, matching transmission lines are used that are connected to the packaged amplifiers for ensuring a proper impedance transform so that each packaged amplifier sees a desired impedance. This matching line introduces a phase rotation. A further phase rotation is introduced by the packaged amplifier itself. To ensure that the combined phase rotation fulfils the requirements described above, phase offset lines are used. In practice this means that the combined phase rotation of the amplifier itself, the matching lines, and the offset lines roughly equals 180 degrees.

In the known device, the Chireix compensating elements are realized in the matching lines. More in particular, the matching lines for the second and third amplifying units have a different length and the phase delay of these lines can be expressed as θm+dθ and θm−dθ, respectively, wherein θm corresponds to the phase delay of the matching lines for the first and fourth amplifying units. The phase offset dθ ensures that both main amplifiers see a different reactive part as explained above.

The Applicant has found that the bandwidth of the abovementioned known device, in which a Doherty amplifier and an outphasing amplifier are combined, is not always satisfactory, in particular when operating in the outphasing mode. This is related to the 180 degrees combined internal rotation that is needed to ensure proper Doherty operation.

An object of the present invention is to provide an amplifying device in which an outphasing amplifier is combined with a Doherty amplifier and for which the bandwidth can be improved.

This object is achieved using the amplifying device as defined in claim 1 which is characterized in that outputs of the impedance matching networks that are coupled to the amplifiers of the first and fourth packaged amplifying units are coupled to the combining node via a respective impedance inverter. Moreover, each respective matching network is incorporated in the same packaged amplifying unit as the amplifier it is connected to, and wherein the first Chireix compensating element and the second Chireix compensating element are absorbed in the matching network for the amplifiers of the second and third amplifying units, respectively.

According to the present invention, each matching network constitutes a class E matching network, and each class E matching network comprises a respective series inductor having a first terminal coupled to an output of the respective amplifier and a second terminal, and a respective shunt capacitor coupled in between the second terminal and ground. The first and second Chireix compensating elements are realized by a difference in inductance of the series inductor for the second and third packaged amplifying units.

The Applicant has realized that using the class E matching network with the series inductor and shunt capacitor within the packaged amplifying unit allows an internal rotation to be achieved that is approximately 90 degrees between the intrinsic drain and the output of the class E matching network. The Applicant further realized that such internal rotation facilitates an inverted Doherty type of operation without relying on long transmission lines that would be detrimental to the bandwidth of the overall device. More in particular, the amplifiers of the first and fourth amplifying units, which act as peak amplifiers in the Doherty mode, are connected to the combining node via a respective impedance inverter, and the amplifiers of the second and third amplifying units, which act as main amplifier in the Doherty mode, are connected to the combining node directly. In this manner, the relatively long 180 degrees transmission lines of the device of Qureshi et al can be avoided thereby improving bandwidth while still allowing proper load modulation when operating in the Doherty mode.

Therefore, according to the invention, the number of transmission lines has been reduced with respect to the abovementioned known device. This is made possible by using matching networks in which the Chireix compensating elements are absorbed. As these networks introduce a phase shift, typically of about 90 degrees, it becomes possible to omit the impedance inverter for the second and third packaged amplifying units, thereby improving bandwidth under back-off conditions.

Outputs of the impedance matching networks that are coupled to the amplifiers of the second and third amplifying units can be coupled to the combining node directly. Within the context of the present invention, directly connected should be construed as a connection having an absolute phase delay in an operating frequency range that is significantly less than 90 degrees, preferably less than 20 degrees.

The series inductors of the class E matching networks for the second and third packaged amplifying units can be realized using one or more bondwires. In this case, the first and second Chireix compensating elements can be realized by using a different length, height and/or shape for the one or more bondwires that form the series inductors. In this manner, no additional components are needed for realizing the Chireix compensating elements.

The amplifiers of the second and third packaged amplifying units may be realized on one or more semiconductor dies, and the series inductors of the class E matching networks for the second and third packaged amplifying units may be realized using metal tracks arranged on the one or more semiconductor dies. For example, the metal tracks could be in the form of bondwires, copper deposit lines on top of redistribution layers (RDL), among others, wherein the first and second Chireix compensating elements are realized by using a different length, height, width and/or shape of the metal tracks.

The amplifiers of the first and fourth packaged amplifying units can be identical and an inductance value of the series inductor of the matching network of the first and fourth amplifying unit may equal L1. Within the context of the present invention, amplifiers are considered identical when they comprise substantially the same power transistor. As a particular example, identical amplifiers may have an identical output capacitance.

The value L1 can be derived from $q=1/(\omega(L1Cd)^{0.5})$, wherein Cd is the output capacitance of the first amplifier, q a constant between 1.2 and 1.4, and more preferably between 1.25 and 1.35, and even more preferably equal to 1.3, and wherein ω is an operational frequency of the amplifying device. A value for shunt capacitor C for the first and fourth amplifying units can be found such that the fundamental and harmonic admittances seen by the amplifier of these amplifying units correspond to the so-called quasi-load insensitive class E configuration. This configuration is well known in the art and is for example described in the paper "High Efficiency and Wide Bandwidth Quasi-Load Insensitive Class-E Operation Utilizing Package Integration" by Qureshi et al, IEEE Transactions on Microwave Theory and Techniques, pages 1-12, 2018, which is incorporated herein by reference.

The amplifiers of the second and third packaged amplifying units may be identical to the amplifiers of the first and fourth packaged amplifying units and an inductance value of the series inductor of the matching network of the second and third packaged amplifying unit may equal L1+dL and L1−dL, respectively, wherein +dL and −dL correspond to an increase and decrease of the inductance value of the series inductor for realizing the first and second Chireix compensating element, respectively. The increase or decrease of the inductance value may for example be achieved if, as described above, the series inductor is realized using one or more bondwires of which the shape, height, and/or length for the bondwires is different compared to nominal values that are used for the bondwire(s) corresponding to the first and fourth packaged amplifying units.

The second terminals of the second and third packaged amplifying units may be connected to each other. For example, these terminals may correspond to the same conductive structure. Additionally or alternatively, the shunt capacitors of the second and third packaged amplifying units may be combined into a single shunt capacitor.

The second and third packaged amplifying unit may be realized using a single first package, wherein the amplifier and the matching network of the first packaged amplifying unit may be realized using a single second package, and wherein the amplifier and the matching network of the fourth packaged amplifying unit may be realized using a single third package. Alternatively, the second and third packaged amplifying units are realized using respective packages.

Each of the first, second, and third package may comprise a package substrate, and one or more first semiconductor dies on which the amplifier(s) of the amplifying unit(s) comprised by the respective package are integrated, wherein the one or more first semiconductor dies is/are mounted on the package substrate. Each of the first, second, and third package may further comprise one or more input leads, and one or more output leads.

An electrical length between an output of the amplifier of the first packaged amplifying unit and the combining node and the electrical length between an output of the amplifier of the fourth packaged amplifying unit and the combining node may each substantially equal m times 180 degrees, with m being an integer >0. Moreover, an electrical length between an output of the amplifier of the second packaged amplifying unit and the combining node may substantially equal (2n−1) times 90 degrees minus a first predefined value, and the electrical length between an output of the amplifier of the third packaged amplifying unit and the combining node may substantially equal (2n−1) times 90 degrees plus said first predefined value, with n being an integer >0. Here, it is noted that these phase delays are relative to an operating frequency within a given operating frequency band, for example corresponding to one of the defined mobile telecommunications bands. In addition the first predefined value corresponds to the first and second Chireix compensating elements.

The amplifiers of the second and third packaged amplifying units may be biased in class B or class AB, and the amplifiers of the first and fourth packaged amplifying units may be biased in class C. When operating in the Doherty mode and when the input drive is increased, the amplifiers will eventually enter into voltage saturation allowing class-E like high efficiency numbers to be achieved. In the outphasing mode, the second and amplifying units operate to form an outphasing amplifier. Also in this mode, high efficiency numbers can be achieved in particular when class E or quasi-load insensitive class E matching networks are used.

The amplifying device may further comprise a printed circuit board on which the packaged amplifying units are mounted, wherein the impedance inverters associated with the first and fourth packaged amplifying units are realized on the printed circuit board, for example as a quarter wavelength transmission line.

The amplifying device may further comprise a first splitter arranged in between the first input and the inputs of the first and second packaged amplifying units. A second splitter may be arranged in between the second input and the inputs of the third and fourth packaged amplifying units. The first splitter can be configured to cause a phase difference, preferably equaling 90 degrees at a predefined operational frequency, between a signal inputted to the input of the first packaged amplifying unit and a signal inputted to the input of the second packaged amplifying unit. The second splitter may be configured to cause a phase difference, preferably equaling 90 degrees at the predefined operational frequency, between a signal inputted to the input of the third packaged amplifying unit and a signal inputted to the input of the fourth packaged amplifying unit. These phase differences are chosen such that when operating in the Doherty mode, all signals add in phase at the combining node.

According to a second aspect, the invention provides an amplifying system configured for generating a predefined modulated signal. Such predefined modulated signal may for example be a 16QAM or QPSK modulated signal to be used in mobile telecommunications. The generated modulated signal typically corresponds to an RF carrier signal of which the amplitude and/or phase is modulated in dependence of data, e.g. a data stream to be transmitted.

The amplifying system may a signal unit for providing a first signal to the first input of the amplifying device and for providing a second signal to the second input of the amplifying device. In addition, the amplifying system may comprise a controller for controlling the signal unit in order to set an operational mode of the amplifying device.

The signal unit can be configured to, when the amplifying device is controlled to operate in the outphasing mode, control an amplitude of the first and second signals to be equal and constant and to control a phase of the first and second signals to differ by $2\phi$, with $\phi$ being an outphasing angle of which a momentary value is chosen such that a momentary amplitude of the signal outputted by the amplifying device corresponds to the momentary amplitude of the predefined modulated signal.

Additionally or alternatively, the signal unit can be configured to, when the amplifying device is controlled to operate in the Doherty mode, control a phase of the first and second signals to be equal and to control an amplitude of the first and second signals to be equal, wherein the amplitude is controlled such that a momentary value of the amplitude of the signal outputted by the amplifying device corresponds to the momentary amplitude of the predefined modulated signal.

The amplifying device can be configured to be operable in a linear mode in which the amplifiers of the second and third amplifying units are operational and in which the amplifiers of the first and fourth amplifying units are off. In this mode, the second and third amplifying units are operated in a substantially linear region. More in particular, the signal unit can be configured to, when the amplifying device is controlled to operate in the linear mode, control a phase of the first and second signals to differ by 2φ, wherein φ is a time-constant outphasing angle, and to control the amplitude of the first and second signals such that a momentary value of the amplitude of the signal outputted by the amplifying device corresponds to the momentary amplitude of the predefined modulated signal. The linear mode and outphasing mode are often jointly referred to as mixed-mode outphasing mode.

The controller can be configured to determine the intended operational mode of the amplifying device in dependence of a desired or expected power level of the predefined modulated signal. For example, the amplifying system may further comprise a memory having stored therein a look-up table, wherein the look-up table indicates which mode to use for the amplifying device in dependence of the desired or expected power level of the predefined modulated signal. The look-up table may have been constructed by measuring a performance parameter, for example the power added efficiency or efficiency of the amplifying device, for different power levels of the predefined modulated signal obtained using different operational modes.

The desired power level may deviate from the expected power level as the latter power level may include the influences of a known mismatch at the output of the amplifying system. Such mismatch may be determined by measuring the reflected and transmitted power at the output of the amplifying system.

BRIEF DESCRIPTION OF THE DRAWINGS

Next, the present invention will be described in more detail referring to the appended drawings, wherein.

DETAILED DESCRIPTION

Figure 1:
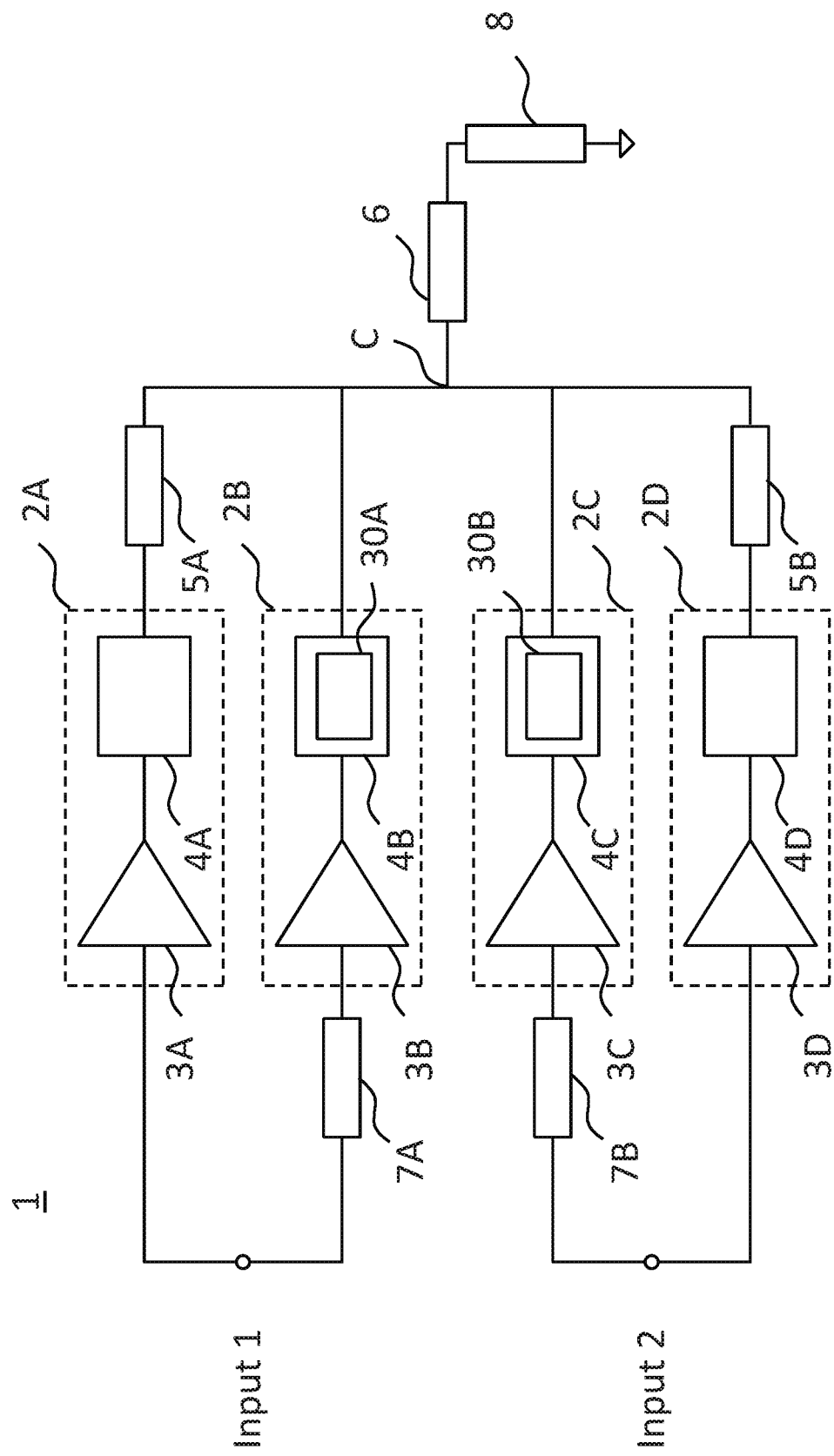
FIG. 1 illustrates an embodiment of an amplifying device in accordance with the present invention.

FIG. 1 illustrates an embodiment of an amplifying device 1 in accordance with the present invention. Device 1 comprises four packaged amplifying units 2A-2D, wherein each amplifying unit comprises a respective amplifier 3A-3D. Each amplifying unit further comprises a respective matching network 4A-4D.

Figure 3:
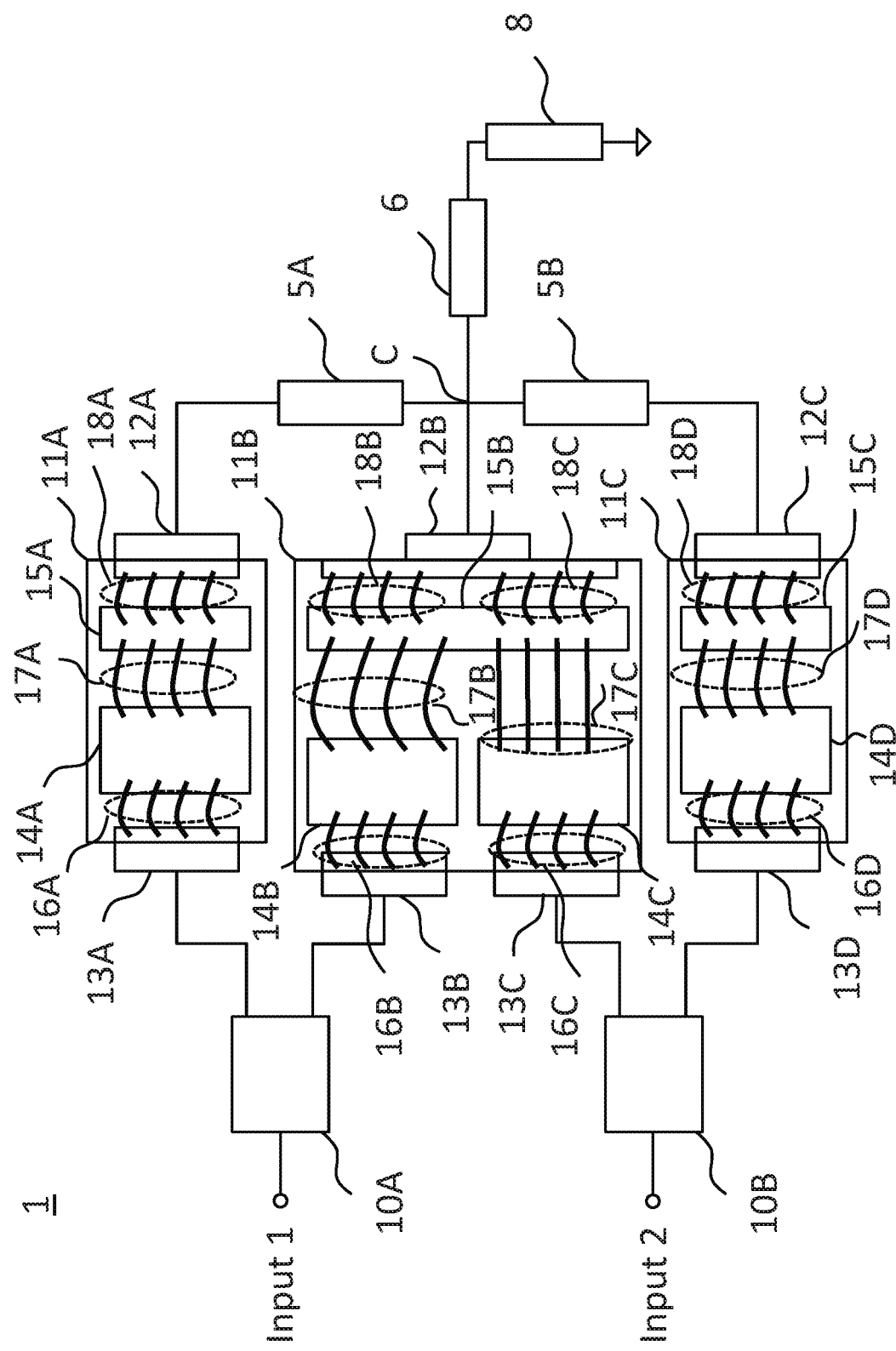
FIG. 3 illustrates an exemplary layout of the device of FIG. 1.

The exemplary layout of device 1, which is shown in FIG. 3, illustrates that amplifying unit 2A comprises a conductive package substrate 11A on which a first semiconductor die 14A and a second semiconductor die 15A are arranged. On first semiconductor die 14A, an RF power transistor is arranged for example a silicon-based laterally diffused metal-oxide-semiconductor (LDMOS) transistor or a Gallium Nitride based field-effect transistor (FET).

Second semiconductor die 15A may be a passive die in the sense that it comprises no active elements. More in particular, a capacitor may be arranged on semiconductor die 15A, such as a metal-oxide-semiconductor (MOS) capacitor or a metal-insulator-metal (MIM) capacitor.

Second amplifying unit 2A comprises a first plurality of bondwires 16A connecting input lead 13A to an input terminal of the transistor on first semiconductor die 14A. This connection can be a direct connection, as shown in FIG. 3, or an indirect connection in which a matching network is arranged in series in between input lead 13A and the input terminal of the transistor. A second plurality of bondwires 17A is used for connecting the RF power transistor to second semiconductor die 15A. More in particular, bondwires 17A connect the output terminal of the RF power transistor to a first terminal of the capacitor arranged on second semiconductor die 15A. A second terminal of this capacitor may be grounded and may be achieved through the conductive substrate 11A.

The first terminal of the capacitor is connected, via a third plurality of bondwires 18A, to output lead 12A.

Figure 2:
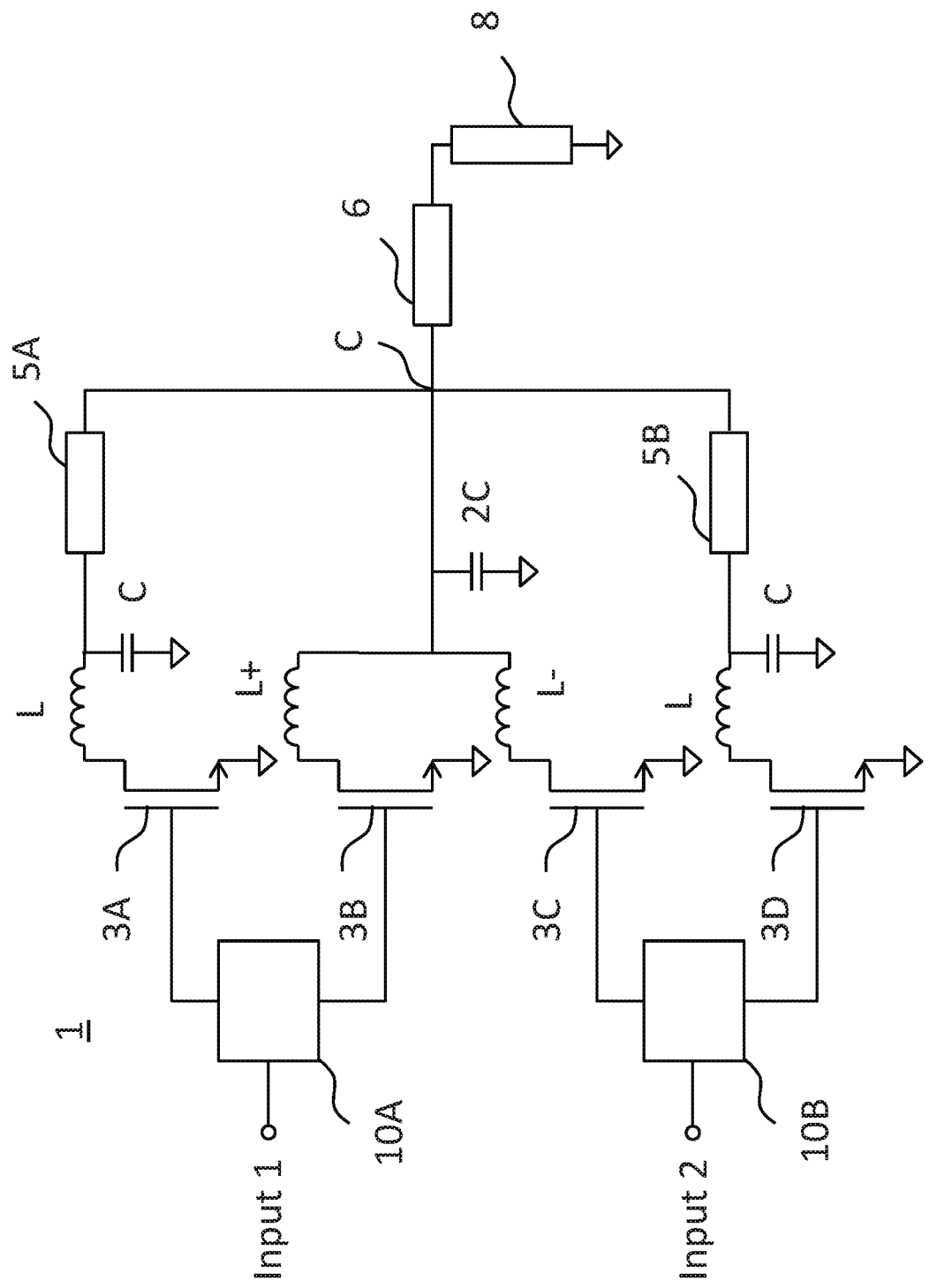
FIG. 2 illustrates an equivalent circuit of the device of FIG. 1.

In the equivalent circuit of device 1 shown in FIG. 2, the amplifier of amplifying unit 2A is referred to as transistor 3A. Moreover, the second plurality of bondwires 17A is represented by inductor L which has an inductance L1, and the capacitor on second semiconductor die 15A is represented by capacitor C having a capacitance C1.

It should be noted that the present invention is not limited to the layout shown in FIG. 3. For example, in a different layout, bondwires 17A could extend between the output of the RF power transistor and output lead 12A, and third bondwires 18A could extend between output lead 12A and the first terminal of the capacitor on second semiconductor die 15A.

FIG. 3 further shows that fourth packaged amplifying unit 3D is configured in a similar manner as first packaged amplifying unit. More in particular, fourth amplifying unit 2D comprises a first plurality of bondwires 16D connecting input lead 13D to an input terminal of the transistor on first semiconductor die 14D. This connection can be a direct connection, as shown in FIG. 3, or an indirect connection in which a matching network is arranged in series in between input lead 13D and the input terminal of the transistor. A second plurality of bondwires 17D is used for connecting the RF power transistor to second semiconductor die 15C. More in particular, bondwires 17D connect the output terminal of the RF power transistor to a first terminal of the capacitor arranged on second semiconductor die 15C. A second terminal of this capacitor may be grounded and may be achieved through the conductive substrate 11C.

The first terminal of the capacitor is connected, via a third plurality of bondwires 18D, to output lead 12C.

In the equivalent circuit of device 1 shown in FIG. 2, the amplifier of amplifying unit 2D is referred to as transistor 3D. Moreover, the second plurality of bondwires 17D is represented by inductor L which has an inductance L1, and the capacitor on second semiconductor die 15C is represented by capacitor C having a capacitance C1.

It should be noted that the present invention is not limited to the layout shown in FIG. 3. For example, in a different layout, bondwires 17D could extend between the output of the RF power transistor and output lead 12C, and third bondwires 18D could extend between output lead 12C and the first terminal of the capacitor on second semiconductor die 15C.

In the embodiment of FIGS. 2 and 3, first amplifier 3A and fourth amplifier 3D are substantial identical. For example, an identical or substantially identical transistor layout can be used for realizing amplifiers 3A, 3D.

Second and third amplifying units 2B, 2C are realized in a single package. This package comprises two parallel paths that are arranged similar to amplifying units 3A, 3D. Each path comprises a separate first semiconductor die, referred to as first semiconductor die 14B or 14C, but both paths share the same second semiconductor die 15B.

A first plurality of bondwires 16B connects input lead 13B to an input terminal of the transistor on second semiconductor die 14B. This connection can be a direct connection, as shown in FIG. 3, or an indirect connection in which a matching network is arranged in series in between input lead 13B and the input terminal of the transistor. A second plurality of bondwires 17B is used for connecting the RF power transistor to second semiconductor die 15B. More in particular, bondwires 17B connect the output terminal of the RF power transistor to a first terminal of the capacitor arranged on second semiconductor die 15B. A second terminal of this capacitor may be grounded and may be achieved through the conductive substrate 11B.

In addition, a first plurality of bondwires 16C connects input lead 13C to an input terminal of the transistor on second semiconductor die 14C. This connection can be a direct connection, as shown in FIG. 3, or an indirect connection in which a matching network is arranged in series in between input lead 13C and the input terminal of the transistor. A second plurality of bondwires 17C is used for connecting the RF power transistor to second semiconductor die 15B. More in particular, bondwires 17C connect the output terminal of the RF power transistor to a first terminal of the capacitor arranged on second semiconductor die 15B. A second terminal of this capacitor may be grounded and may be achieved through the conductive substrate 11B.

The first terminal of the capacitor is connected, via a third plurality of bondwires 18B, 18C to output lead 12B.

In the equivalent circuit of device 1 shown in FIG. 2, the amplifiers of amplifying units 2B, 2C are referred to as transistor 3B, 3C, respectively. Moreover, the second plurality of bondwires 17B is represented by inductor L+ which has an inductance equaling L1+dL, the third plurality of bondwires 17C is represented by inductor L−dL which has an inductance equaling L1−dL In addition, the capacitor on second semiconductor die 15B is represented by capacitor 2C having a capacitance that equals 2C1.

It should be noted that the present invention is not limited to the layout shown in FIG. 3. For example, in a different layout, bondwires 17B, 17C could extend between the output of the RF power transistor on first semiconductor die 14B, 14C, respectively, and output lead 12B, and third bondwires 18B, 18C could extend between output lead 12B and the first terminal of the capacitor on second semiconductor die 15B.

In the embodiment of FIGS. 2 and 3, second amplifier 3B and third amplifier 3C are substantial identical. For example, an identical or substantially identical transistor layout can be used for realizing amplifiers 3B, 3C. Moreover, second amplifiers 3A-3D could all be substantial identical.

As shown in FIGS. 2-3, device 1 comprises an input splitter 10A arranged between the first input ("input 1") and the input terminals of amplifiers 3A, 3B, and an input splitter 10B arranged between the second input ("input 2") and the input terminals of amplifiers 3C, 3D. Input splitter 10A introduces a phase delay of 90 degrees in the signal fed to amplifier 3B relative to the signal fed to amplifier 3A. Similarly, input splitter 10B introduces a phase delay of 90 degrees in the signal fed to amplifier 3C relative to the signal fed to amplifier 3D.

In FIG. 1, input splitters 10A, 10B shown in FIGS. 2 and 3, are represented by an ideal splitter for which one output branch comprises a 90 degrees phase shifter 7A, 7B.

Furthermore, the output of amplifying units 3A and 3D are connected via respective impedance inverters 5A, 5B to combining node C. This latter node is also connected to the outputs of amplifying units 3B, 3C and to load 8 via an optional impedance inverter 6.

Impedance inverters 6, 5A, 5B can be realized using quarter-wave length transmission lines, for example realized on printed circuit board.

The phase delay introduced by the matching networks 4A-4D substantially equals 90 degrees. It can then be verified that the phase delay between the first input and combining node C is identical irrespective of the path followed. The same holds for the phase delay between the second input and combining node C.

Inductance value L1 is derived from $q=1/(\omega(L1Cd)^{0.5})$, wherein Cd is the output capacitance of each amplifier 3A-3D, q a constant equal to 1.3, and wherein $\omega$ is an operational frequency of the amplifying device. A value for C1 is chosen such that the fundamental and harmonic admittances seen by amplifiers 3A-3D correspond to the so-called quasi-load insensitive class E configuration. These types of matching networks introduce a phase shift of substantially 90 degrees.

Device 1 is operable in two modes. In an outphasing mode, first amplifier 3A and fourth amplifier 3D are off and second amplifier 3B and third amplifier 3C cooperate to form an outphasing amplifier. In this mode, the signals fed at the two inputs have substantially the same amplitude but differ in phase. These signals can for instance be generated using a dedicated signal unit on the basis of a signal to be amplified.

In the outphasing mode, the signals to be fed to the first input and second input are constant envelope signals different in phase by an amount equal to $2\phi$, wherein $\phi$ is referred to as the outphasing angle. By varying the outphasing angle, the power delivered to the load can be controlled.

To improve the efficiency at back off power levels, Chireix compensating elements are used. More in particular, the Chireix compensating elements are configured compensate for reactive impedances seen by the second amplifier 3B and third amplifier 3C. It should be noted that the reactive impedances generally vary with the outphasing angle. The compensating elements are therefore usually designed by optimizing performance, e.g. efficiency, over a certain back off power range. The actual design of Chireix compensating elements is well known in the art, see for example the PhD thesis "High Efficiency RF Power Amplifier Architectures" by Qureshi et al, TU Delft, 2012, ISBN 978-94-6203-071-8.

According to the invention, in the outphasing mode, an outphasing amplifier is formed using amplifiers 3B, 3C and matching networks 4B, 4C. Furthermore, matching networks 4B, 4C each preferably correspond to a QLI class E matching network comprising a series inductor and a shunt capacitor in which, for each matching network, a respective Chireix compensating elements is integrated by varying the inductance of the series inductor. More in particular, the inductance value is changed by varying at least one of a shape, height, and length of the bondwire. In this manner, a low-complexity matching network can be obtained by which a high bandwidth can be obtained when compared to other topologies in which more bandwidth sensitive components are used.

The inductance values of matching networks 4B, 4C can be represented by L+=L1+dL and L−=L1−dL, respectively, wherein L1 is a nominal value and dL the contribution associate with the Chireix compensating element. Similarly, the capacitance of the shunt capacitor can be represented by C1. As shown in FIG. 3, second and third amplifiers 3B, 3C are within the same package. This allows the shunt capacitors to be combined on a single semiconductor die 15B, resulting in a capacitor having a capacitance equal to 2C1. It should be noted that the present invention does not exclude embodiments wherein amplifiers 3B, 3C are integrated on the same semiconductor die.

Because amplifiers 3A-3D are substantially identical, the same inductance and capacitance values, i.e. L1 and C1, can be used for matching network 4A and matching network 4D. The present invention does however not exclude embodiments wherein amplifiers 3A, 3D are different from 3B, 3C. For example, amplifiers 3A, 3D can be configured to output higher powers than amplifiers 3B, 3C. However, it is preferred to have amplifiers 3A and 3D of equal size and to have amplifiers 3B and 3C of equal size.

When the device operates in the Doherty mode, all amplifiers 3A-3D are on. In this mode, amplifiers 3A and 3B cooperate to form a first Doherty amplifier (DPA). Amplifiers 3C and 3D cooperate to form a second DPA. When amplifiers 3A, 3D are larger than amplifiers 3B, 3C, the DPAs are asymmetrical. When all amplifiers 3A-3D are of equal size, symmetrical DPAs are formed.

Impedance inverters 5A, 5B introduce the impedance modulation that is required in DPAs. Inverters 5A. 5B are arranged in between amplifiers 3A, 3D, which act as peak amplifiers of the DPAs in the Doherty mode, and combining node C. In that respect, the configuration can be referred to as an inverted DPA. Furthermore, in combination with the phase delay elements in the input part of device 1, it is ensured that the signals amplified by amplifiers 3A-3D all add up in phase at combining node C.

To achieve the above described modes, amplifiers 3A, 3D are preferably biased in class C. This would ensure that amplifiers 3A, 3D only become operational at relatively high input powers. Amplifiers 3B, 3C are preferable biased in class AB or class B.

Figure 4:
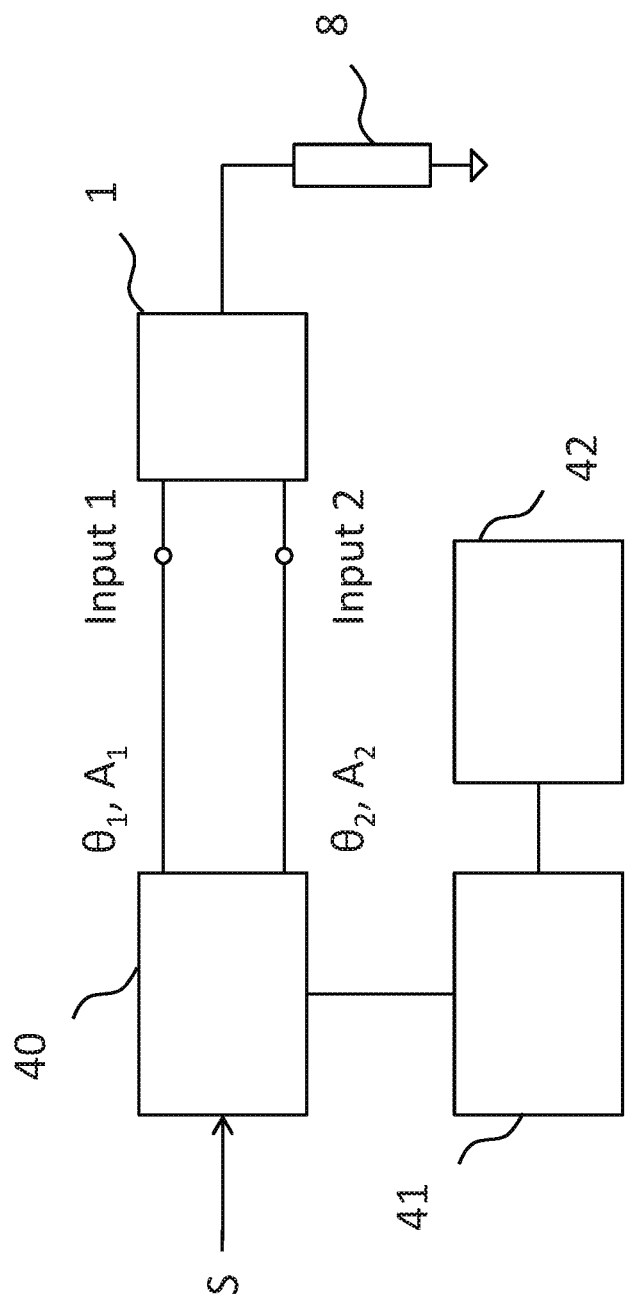
FIG. 4 illustrates an amplifying system in accordance with the present invention.

FIG. 4 illustrates an amplifying system 100 in accordance with the present invention. System 100 comprises an amplifying device 1 as illustrated in FIGS. 1-4, and a signal unit 40 for generating the signals to be fed to the first and second inputs. Signal unit 40 is controlled by a controller 41, which is connected to a memory 42.

A first signal to be fed to the first input of amplifying device 1 and a second signal to be fed to the second input of amplifying device 1 generally have a time-varying amplitude and phase offset.

What type of signal is generated in signal unit 40 depends on the intended mode of operation and the desired modulation. In general, a signal Sout at the output of amplifying device 1 having amplitude and phase modulation of a carrier signal with carrier frequency ω can be denoted as Sout=A(t)·cos(ωt+θ(t)), with A(t) the time-dependent amplitude, and ωt+θ(t) the phase in which θ(t) represents the phase modulation.

When operating in the outphasing mode, the first signal S1 and second signal S2 are generated corresponding to S1(t)=Amax/(2G$_2$)·cos(ωt+θ(t)+φ(t)) and S2(t)=Amax/(2G$_3$)·cos(ωt+≥(t)−φ(t)), wherein G$_2$ and G$_3$ are the identical signal gains of the second and third amplifying units, respectively. Amax the maximum amplitude, and φ(t)=cos$^{-1}$(A(t)/Amax) the outphasing angle.

When operating in the Doherty mode, the first signal S1 and second signal S2 are generated corresponding to S1(t)=S2(t)=Amax/(2G)·cos (ωt+θ(t)), wherein G is the signal gain of the first Doherty amplifier formed by the first and second amplifying units, which gain is equal to the signal gain of the second Doherty amplifier formed by the third and fourth amplifying units.

When operating in the linear mode, the first signal S1 and second signal S2 are generated corresponding to S1(t)=A*(t)/(2G$_2$)·cos(ωt+θ(t)+φth) and S2(t)=A*(t)/(2G$_3$)·cos(ωt+θ(t)−φth), wherein φth equals a predefined and constant outphasing angle and wherein A*(t)cos(φth)=A(t).

When the predefined modulated signal only comprises amplitude modulation, θ(t) can be set to a constant value, e.g. 0.

Amplifying system 100 may comprise a look-up table that lists for each desired or expected power level of the generated modulated signal the best mode to use and corresponding parameters. This table is stored in a memory 42 and is generally pre-programmed. An exemplar) entry of this table could be Pout=50 dBm, outphasing mode, A1=100V, A2=100V, φ=10 degrees. Here, A1=100V expresses the amplitude to be used for the first signal which corresponds to Amax/(2G$_2$). In addition, φ=10 degrees is the outphasing phase to be used, which, together with the amplitudes to be used for the first and second signals, results in the desired 50 dBm modulated signal at the output when the amplifying device operates in the outphasing mode.

Similar entries could be made for other modes and other output powers. Here, output power refers to the momentary output power associated with the modulated carrier. In practice, different operational modes may be selected depending on the desired momentary value of the amplitude of the modulated signal.

It should be further noted that signal unit 40 can be implemented digitally. In other implementations, signal unit 40 receives a non-modulated carrier signal from which it derives the signals for the first and second inputs of the amplifying device 1.

Figure 5:
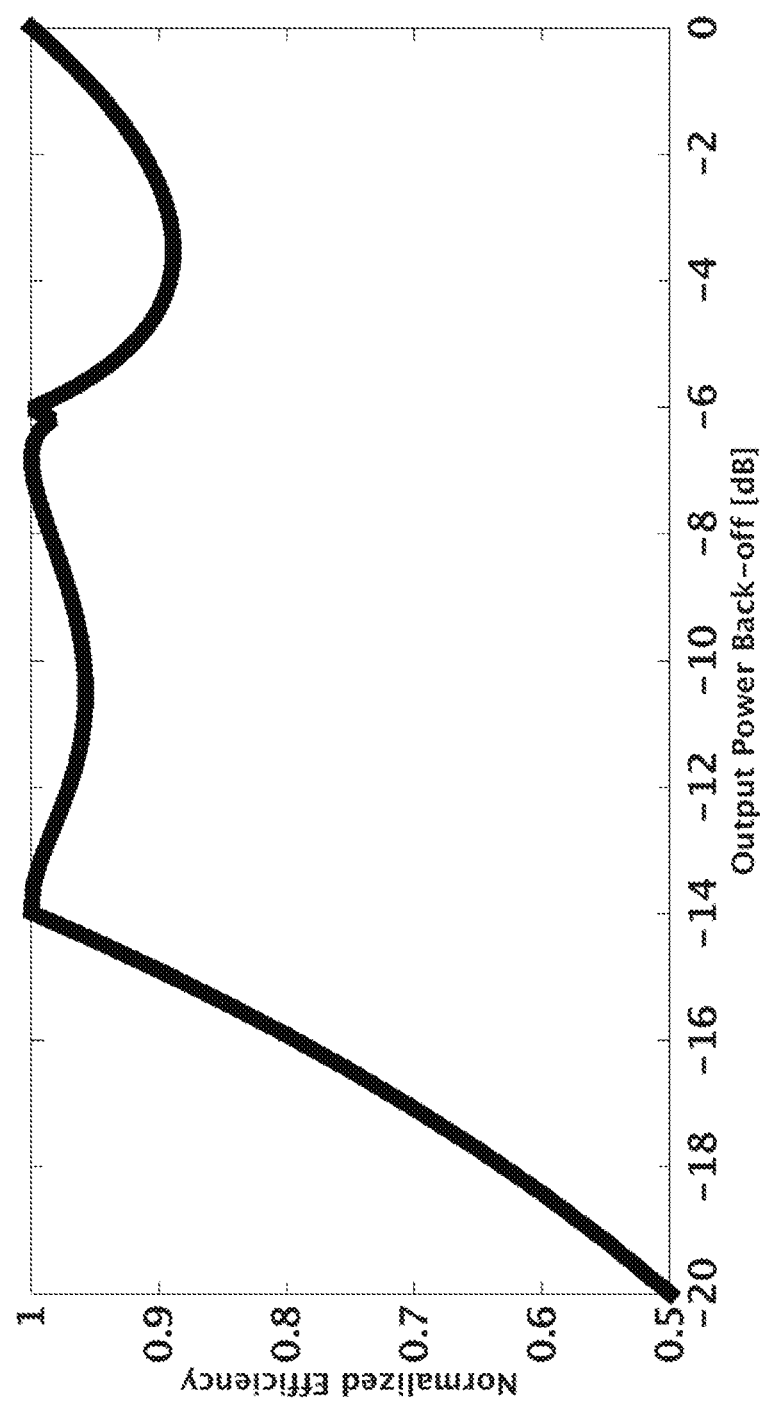
FIG. 5 illustrates back-off performance of the system of FIG. 4.

FIG. 5 illustrates an overview of the efficiency of amplifying system 100 as a function of output power. Here, it is shown that for output powers below −14 dB back off the linear mode is used, for output powers between −14 dB and −6 dB back off the outphasing mode, and for output powers larger than −6 dB back off the Doherty mode.

As explained above, the amplifying device and system of the present invention allow high efficiencies to be reached under large power back-off. This has been realized using an efficient integration of Chireix compensating elements and QLI class E matching networks and implementing these techniques in an amplifier line-up that allows multiple modes of operation.

The present invention has been explained using detailed embodiments thereof. The skilled person will appreciate that various modifications to these embodiments are possible without deviating from the scope of the invention, which is defined by the appended drawings.

The invention claimed is:

1. An amplifying device for providing an amplified signal to a load, the amplifying device comprising:
   a first input and a second input;
   a plurality of packaged amplifying units, each amplifying unit of the plurality of amplifying units comprising a respective amplifier, wherein each of a first amplifying unit and a second amplifying unit of the plurality of amplifying units has an input connected to the first input, and wherein each of a third amplifying unit and a fourth amplifying unit of the plurality of amplifying units has an input connected to the second input;
   a plurality of impedance matching networks, each impedance matching network of the plurality of impedance matching networks being coupled to a respective amplifier of the plurality of amplifying units;

wherein the amplifying device is configured to be operable in:
  (i) an outphasing mode in which the amplifiers of the second and third amplifying units are operational and in which the amplifiers of the first and fourth amplifying units are off, and wherein the amplifiers of the second and third amplifying units cooperate to form an outphasing amplifier, and
  (ii) a Doherty mode in which the amplifiers of the first and second amplifying units cooperate to form a first Doherty amplifier and in which the amplifiers of the third and fourth amplifying units cooperate to form a second Doherty amplifier;

the amplifying device further comprising a first Chireix compensating element and a second Chireix compensating element for compensating a reactive part of a load seen by the amplifier of the second amplifying unit and the amplifier of the third amplifying unit, respectively, for a predefined outphasing angle when operating in the outphasing mode;

wherein signals amplified by the plurality of packaged amplifying units are combined in a combining node;

wherein outputs of the impedance matching networks that are coupled to the amplifiers of the first and fourth packaged amplifying units are coupled to the combining node via respective impedance inverters;

wherein each respective matching network of the plurality of matching networks is incorporated in the same packaged amplifying unit as the amplifier it is connected to, and wherein the first Chireix compensating element and the second Chireix compensating element are incorporated in the matching networks for the amplifiers of the second and third amplifying units, respectively;

wherein each matching network of the plurality of matching network comprises a class E matching network, and wherein each class E matching network comprises:
  (i) a respective series inductor having a first terminal coupled to an output of the respective amplifier and a second terminal; and
  (ii) a respective shunt capacitor coupled in between the second terminal and ground, wherein the first and second Chireix compensating elements are realized by a difference in inductance of the series inductors for the second and third packaged amplifying units.

2. The amplifying device according to claim 1, wherein outputs of the impedance matching networks that are coupled to the amplifiers of the second and third packaged amplifying units are coupled to the combining node directly.

3. The amplifying device according to claim 1, wherein the series inductors of the class E matching networks for the second and third packaged amplifying units are realized using one or more bondwires, and wherein the first and second Chireix compensating elements are realized by using a different length, height, or shape for the one or more bondwires that form the series inductors.

4. The amplifying device according to claim 1, wherein the amplifiers of the first and fourth packaged amplifying units are identical and wherein an inductance value of the series inductors of the matching networks of the first and fourth amplifying units equals L1;
  wherein L1 is derived from $q=1/(\omega(L1Cd)^{0.5})$, wherein Cd is an output capacitance of the first amplifier, q a constant between 1.2 and 1.4, and $\omega$ is an operational frequency of the amplifying device.

5. The amplifying device according to claim 4, wherein the amplifiers of the second and third packaged amplifying units are identical to the amplifiers of the first and fourth packaged amplifying units, and wherein an inductance value of the series inductors of the matching networks of the second and third packaged amplifying units equals L1+dL and L1−dL, respectively, wherein +dL and −dL correspond to an increase and decrease of the inductance value of the series inductor for realizing the first and second Chireix compensating elements, respectively.

6. The amplifying device according to claim 1, wherein the second terminals of the series inductors of respective class E matching networks incorporated in the second and third packaged amplifying units are connected to each other.

7. The amplifying device according to claim 1, wherein the shunt capacitors of the second and third packaged amplifying units are combined into a single shunt capacitor.

8. The amplifying device according to claim 1, wherein the second and third packaged amplifying units are realized using a single first package, wherein the amplifier and the matching network of the first packaged amplifying unit are realized using a single second package, and wherein the amplifier and the matching network of the fourth packaged amplifying unit are realized using a single third package.

9. The amplifying device according to claim 8, wherein each of the first, second, and third packages comprises:
  a package substrate;
  one or more first semiconductor dies on which the amplifier(s) of the amplifying unit(s) comprised by the respective package are integrated, wherein the one or more first semiconductor dies are mounted on the package substrate;
  one or more input leads; and
  one or more output leads.

10. The amplifying device according to claim 1, wherein (i) an electrical length between an output of the amplifier of the first packaged amplifying unit and the combining node and (ii) an electrical length between an output of the amplifier of the fourth packaged amplifying unit and the combining node each substantially equals m times 180 degrees, with m being an integer >0; and
  wherein an electrical length between an output of the amplifier of the second packaged amplifying unit and the combining node substantially equals (2n−1) times 90 degrees minus a first predefined value, and wherein an electrical length between an output of the amplifier of the third packaged amplifying unit and the combining node substantially equals (2n−1) times 90 degrees plus the first predefined value, with n being an integer >0.

11. The amplifying device according to claim 1, wherein the amplifiers of the second and third packaged amplifying units are biased in class B or class AB, and wherein the amplifiers of the first and fourth packaged amplifying units are biased in class C.

12. The amplifying device according to claim 1, further comprising a printed circuit board on which the packaged amplifying units are mounted, wherein the impedance inverters associated with the first and fourth packaged amplifying units are realized on the printed circuit board as quarter wavelength transmission lines.

13. The amplifying device according to claim 1, further comprising:
  a first splitter arranged in between the first input and the inputs of the first and second packaged amplifying units; and a second splitter arranged in between the second input and the inputs of the third and fourth packaged amplifying units;

wherein the first splitter is configured to cause a phase difference between a signal inputted to the input of the first packaged amplifying unit and a signal inputted to the input of the second packaged amplifying unit, and wherein the second splitter is configured to cause a phase difference between a signal inputted to the input of the third packaged amplifying unit and a signal inputted to the input of the fourth packaged amplifying unit.

14. An amplifying system configured for generating a predefined modulated signal, the amplifying system comprising:

the amplifying device according to claim 1;

a signal unit for providing a first signal to the first input of the amplifying device and for providing a second signal to the second input of the amplifying device; and a controller for controlling the signal unit in order to set an operational mode of the amplifying device;

wherein the signal unit is configured to:
(i) when the amplifying device is operating in the outphasing mode, control an amplitude of the first and second signals to be equal and constant, and control a phase of the first and second signals to differ by 2ϕ, with ϕ being an outphasing angle of which a momentary value is chosen such that a momentary amplitude of the signal outputted by the amplifying device corresponds to the momentary amplitude of the predefined modulated signal; and
(ii) when the amplifying device is operating in the Doherty mode, control a phase of the first and second signals to be equal, and control an amplitude of the first and second signals to be equal, the amplitude being controlled such that a momentary value of the amplitude of the signal outputted by the amplifying device corresponds to the momentary amplitude of the predefined modulated signal.

15. The amplifying system according to claim 14, wherein the amplifying device is configured to be operable in a linear mode in which the amplifiers of the second and third amplifying units are operational and in which the amplifiers of the first and fourth amplifying units are off;

wherein the signal unit is configured to, when the amplifying device is operating in the linear mode, control a phase of the first and second signals to differ by 2ϕ, and control the amplitude of the first and second signals such that a momentary value of the amplitude of the signal outputted by the amplifying device corresponds to the momentary amplitude of the predefined modulated signal.

16. The amplifying system according to claim 14, wherein the controller is configured to determine an intended operational mode of the amplifying device in dependence of a desired or expected power level of the predefined modulated signal.

17. The amplifying system according to claim 16, further comprising a memory having stored therein a look-up table, the look-up table indicating which operational mode to use for the amplifying device in dependence of the desired or expected power level of the predefined modulated signal.

18. The amplifying system of claim 17, wherein the look-up table is constructed by measuring a performance parameter for different power levels of the predefined modulated signal obtained using different operational modes.

19. The amplifying system of claim 18, wherein the measured performance parameter is the power added efficiency or efficiency of the amplifying device.

* * * * *